(12) United States Patent
Miwa et al.

(10) Patent No.: US 6,654,273 B2
(45) Date of Patent: Nov. 25, 2003

(54) SHADOW RAM CELL USING A FERROELECTRIC CAPACITOR

(75) Inventors: Tohru Miwa, Tokyo (JP); Hideo Toyoshima, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/964,418

(22) Filed: Sep. 28, 2001

(65) Prior Publication Data

US 2002/0159287 A1 Oct. 31, 2002

(30) Foreign Application Priority Data

Sep. 29, 2000 (JP) ......................................... 2000-299742

(51) Int. Cl.[7] .............................................. G11C 11/22
(52) U.S. Cl. ................... 365/145; 365/154; 365/189.09
(58) Field of Search ................................. 365/145, 154, 365/189.09

(56) References Cited

U.S. PATENT DOCUMENTS

| 4,873,664 | A | | 10/1989 | Eaton, Jr. | |
|---|---|---|---|---|---|
| 5,434,811 | A | * | 7/1995 | Evans et al. | 365/145 |
| 5,741,627 | A | * | 4/1998 | Cubit et al. | 430/321 |
| 6,222,780 | B1 | * | 4/2001 | Takahashi | 365/189.09 |

FOREIGN PATENT DOCUMENTS

| JP | 56-51088 | 5/1981 |
|---|---|---|
| JP | 63-201998 | 8/1988 |
| JP | 2000-293989 | 10/2000 |

* cited by examiner

*Primary Examiner*—Hoai Ho
(74) *Attorney, Agent, or Firm*—Foley & Lardner

(57) ABSTRACT

In a shadow RAM using a ferroelectric capacitor, a memory cell constituted by connecting a ferroelectric capacitor directly to each of storage nodes of an unloaded four-transistor SRAM cell formed of four transistors. Thus, the number of transistors per one memory cell can be reduced by two transistors, so that a storage capacity can be increased further.

27 Claims, 6 Drawing Sheets

SHADOW RAM CELL USING A FERROELECTRIC CAPACITOR

BACKGROUND OF THE INVENTION

The present invention relates to a shadow RAM (Random Access Memory) cell using a ferroelectric capacitor, a non-volatile memory device and a controlling method therefor. More specifically, the present invention relates to a shadow RAM in which each memory cell is constituted of an unloaded four-transistor type SRAM (Static RAM) cell added with ferroelectric capacitors and in which a high speed reading/writing operation is carried out by use of the unloaded four-transistor type SRAM when an electric power is being supplied and a non-volatile memory is realized by use of the ferroelectric capacitors when no electric power is supplied.

Heretofore, various shadow RAMs constituted of a combination of the ferroelectric capacitors and the SRAM cell have been proposed. When an electric power is being supplied, these shadow RAMs can store information in the SRAM cell, and can carry out the reading/writing operation of a high speed comparable to that obtained in a conventional SRAM. In a store operation before the electric power is shut off, the information stored in the SRAM cell is transferred into a polarization direction in the ferroelectric capacitor, so that when no electric power is supplied, a non-volatile memory is realized. In other words, the shadow RAM using the ferroelectric capacitor is a memory device having two features, the non-volatile feature of the ferroelectric capacitor and the high speed operation of the SRAM.

Figure 2:
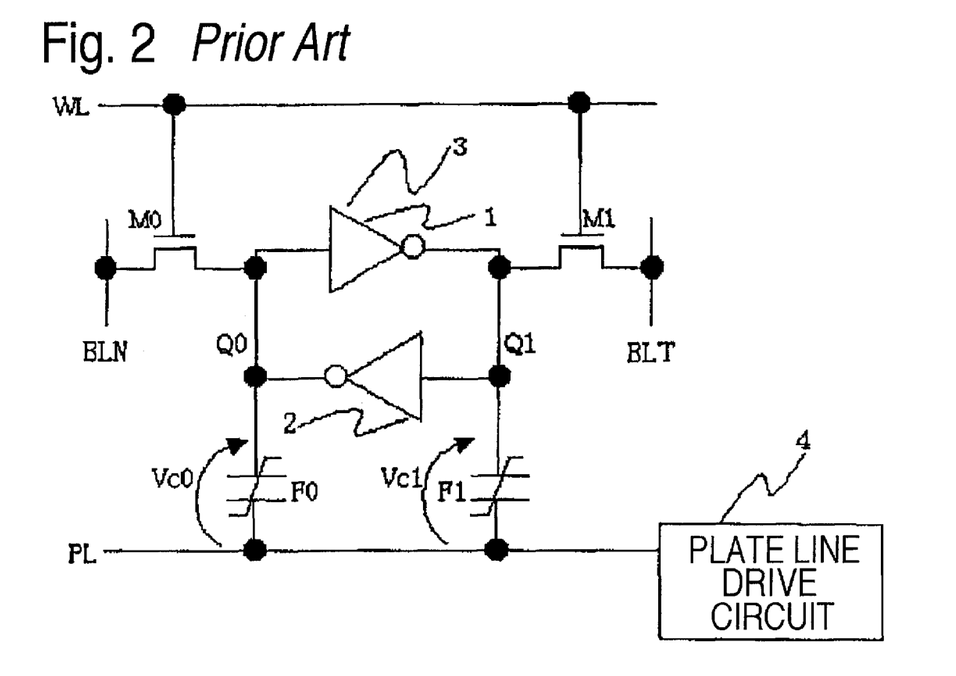
FIG. 2 is a circuit diagram showing an example of the prior art shadow RAM.

For example, a shadow RAM using a ferroelectric capacitor, as disclosed in Japanese Patent Application No. Heisei 11-099534 (published as JP-A-2000-293989), has a memory cell structure as shown in FIG. 2. A flipflop 3 is constituted by connecting an output of each of two inverters 1 and 2 to an input of the other inverter. Two storage nodes Q0 and Q1 of the flipflop are connected to an inverted bit line BLN and a non-inverted bit line BLT through NMOS transistors M0 and M1 acting as an access transistor, respectively. The inverted bit line BLN and the non-inverted bit line BLT are paired, and are connected at their end to a sense amplifier (not shown) for comparing respective voltages on the inverted and non-inverted bit lines to each other.

Furthermore, the bit lines are connected to a writing circuit (not shown) for selectively connecting either of the pair of bit lines to a ground potential in a writing operation, and a precharge circuit (not shown) for precharging the bit lines to either a power supply voltage or the ground potential. Respective gate electrodes of the NMOS transistors M0 and M1 are connected to a common word line WL. The word line WL is connected to a decoder circuit (not shown) for selectively driving one word line to be accessed in accordance with an address signal. Ferroelectric capacitors F0 and F1 having their one end connected to a common plate line PL are connected to the storage nodes Q0 and Q1, respectively. The plate line PL is connected to a plate line driving circuit for maintaining the plate line at Vcc/2 in a power supply condition excluding a store operation and a recall operation.

Now, an operation of the prior art shadow RAM using the ferroelectric capacitors will be described. Incidentally, it would be apparent that the information writing and reading operations for the flipflop 3 is similar to those in the conventional SRAM in the prior art. In an idling operation accompanied with neither a reading nor a writing, all of the word lines are pulled down, the bit lines are precharged to an appropriate potential, and the writing circuit is stopped, so that information in the flipflop is retained.

In order to write information into the flipflop 3, a selected word line WL is pulled up by action of the address decoder, and simultaneously, the writing circuit is driven to bring one of the pair of bit lines BLT and BLN to a low level in accordance with data to be written. When the word line is pulled up, the MOS transistors M0 and M1 are turned on. Since the writing circuit has a driving capability sufficiently larger than that of the inverters 1 and 2, the storage node connected through the MOS transistor to the bit line pulled down by the writing circuit, will be pulled down to the ground potential. Simultaneously, the other storage node is pulled up to the power supply voltage, so that the flipflop becomes stabilized.

In order to read the data from the flipflop 3, after the pair of bit lines are precharged to a high level, a word line is selected, and a potential difference appearing between the selected pair of bit lines is amplified by the sense amplifier. When the word line is pulled up, the MOS transistor interconnecting between the storage node of the low level and the bit line is turned on, so that the bit line concerned starts to drop. The other bit line maintains the high level, since the MOS transistor is not turned on. By discriminating the potential difference between the pair of bit lines by action of the sense amplifier, the information stored in the flipflop is read out.

Figure 3:
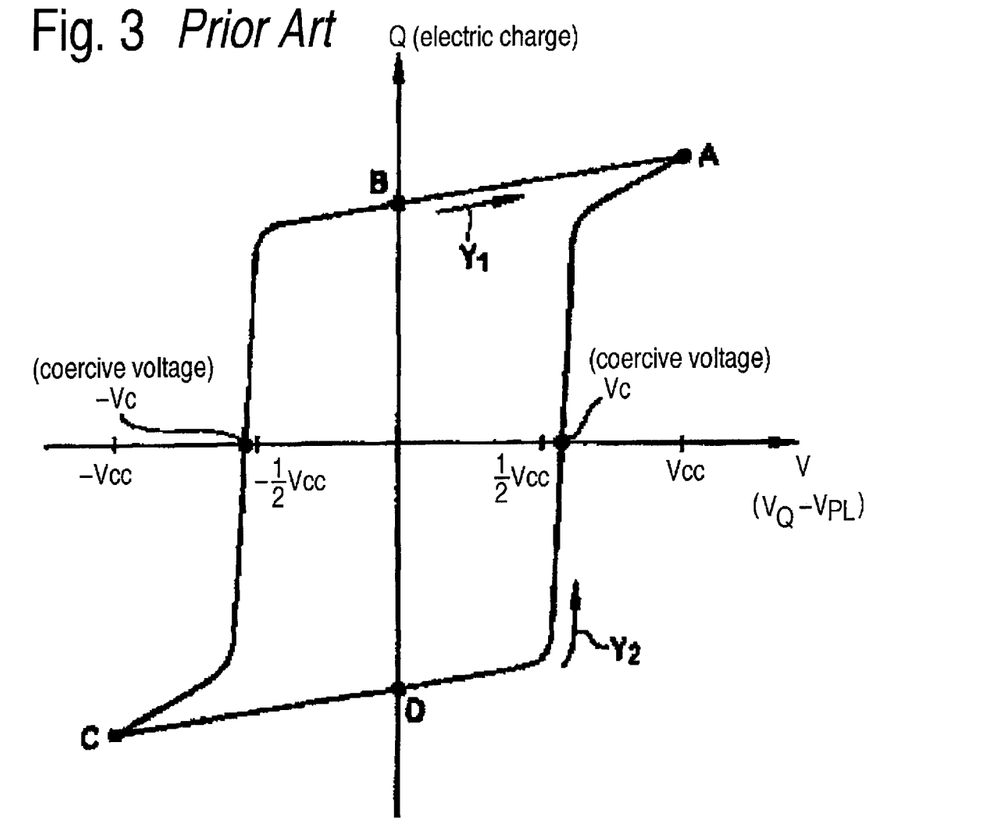
FIG. 3 is a graph showing a hysteresis characteristics of the ferroelectric capacitor on the Q-V plane.
Figure 4:
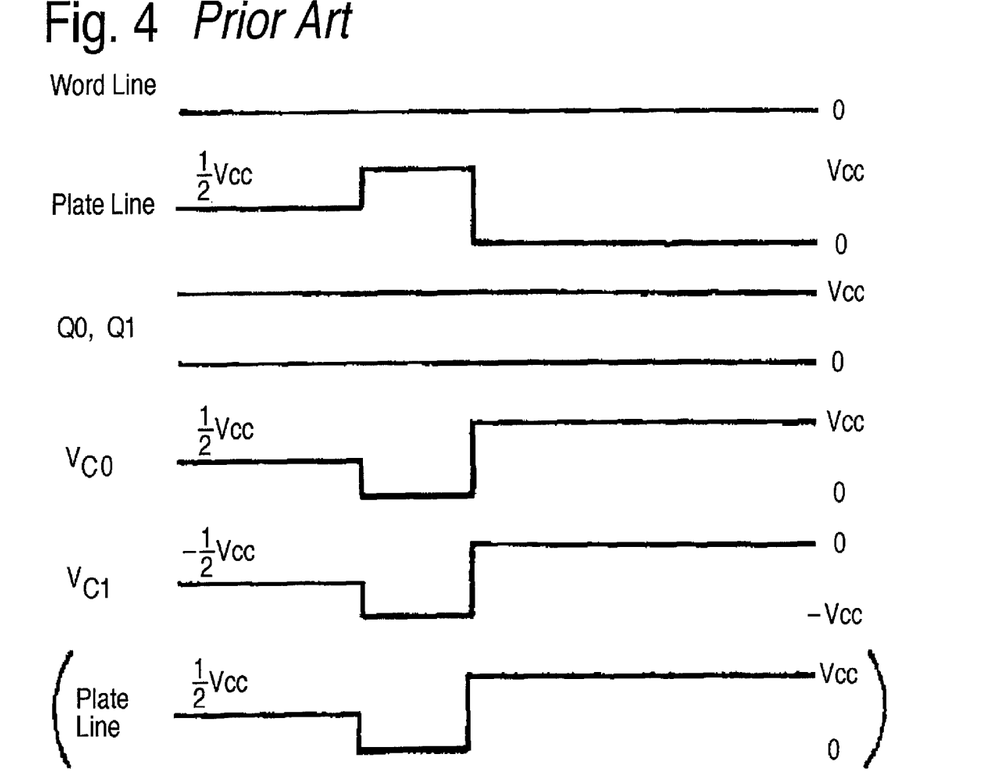
FIG. 4 is a timing chart of the store operation in FIG. 2.

Now, a store operation will be described with reference to FIG. 3 and FIG. 4. FIG. 3 illustrates a hysteresis on a Q-V plane of the ferroelectric capacitors F0 and F1, and FIG. 4 is a timing chart illustrating waveforms on various parts in the store operation. When the electric power is shut off, the data stored in the flipflop is transferred to the polarization direction of the ferroelectric capacitors F0 and F1. This operation is called "store". This store operation is triggered by a drop of the power supply voltage or a store signal supplied before the shutoff of the electric power. The store operation will be carried out in the following procedures:

First, when the store operation starts, the plate line PL is at Vcc/2, so that in accordance with the data stored in the flipflop 3, −Vcc/2 is applied across one of the ferroelectric capacitors connected to the storage node of 0 V, while Vcc/2 is applied across the other ferroelectric capacitor connected to the storage node of the power supply voltage (Vcc).

Here, voltages Vc0 and Vc1 applied across the ferroelectric capacitors F0 and F1, respectively, are defined to be a potential difference between one terminal connected to the plate line PL and the other terminal connected to the storage node Q0 or Q1, by considering the potential at the one terminal connected to the plate line PL as a reference.

Next, the plate line PL is pulled up to Vcc. At this time, in the ferroelectric capacitor previously applied with Vcc/2, the voltages at opposite ends of that ferroelectric capacitor become Vcc, with the result that the voltage across the ferroelectric capacitor becomes 0 V. −Vcc is applied across the other ferroelectric capacitor, so that the condition of the other ferroelectric capacitor moves to a point C in the hysteresis loop shown in FIG. 3.

Thereafter, the plate line PL is pulled down to 0 V. At this time, Vcc is applied across the ferroelectric capacitor connected to the storage node of Vcc, so that the ferroelectric capacitor moves to a point A in the hysteresis loop shown in FIG. 3. Simultaneously, the ferroelectric capacitor that was at the point C moves to a point D, so that a negative remanent polarization is held.

Finally, the electric power is shut off. After the shutoff of the electric power, each node is converged to the ground potential. Accordingly, the ferroelectric capacitor that was at the point A finally moves to a point B, so that a positive remanent polarization is held. Since the ferroelectric capacitor can hold the remanent polarization not less than ten years in a condition in which no voltage is applied, the conventional shadow RAM using the ferroelectric capacitor can realize a non-volatile memory.

Figure 5:
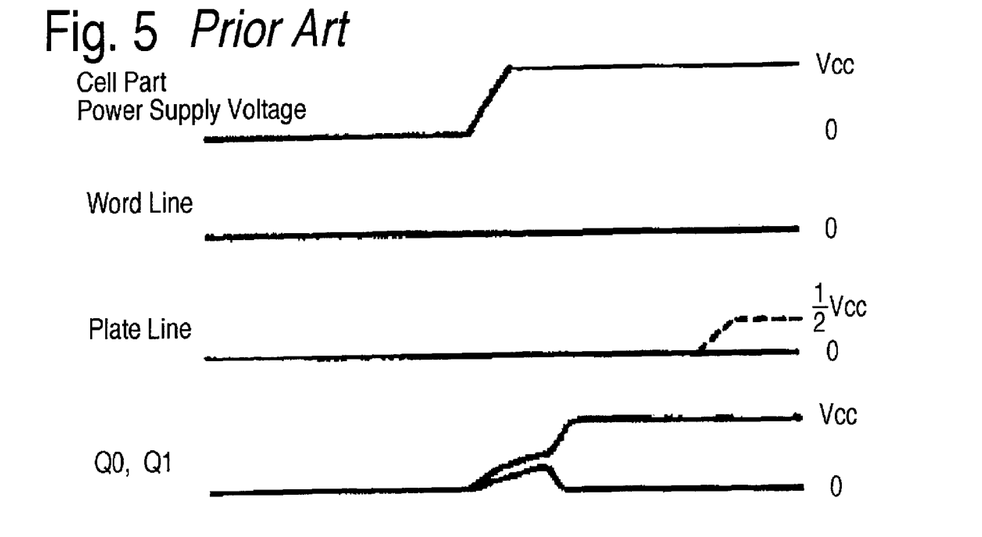
FIG. 5 is a timing chart of the recall operation in FIG. 2.

Next, the recall operation will be described with timing charts of various parts shown in FIG. 5. When the electric power is turned on, the data held in the ferroelectric capacitors is transferred to the flipflop. This operation is called "recall". When the electric power is turned on, if only the power supply voltage of the flipflop 3 is pulled up while maintaining the word line WL and the plate line PL at the low level, it becomes possible to reproduce in the flipflop 3 the data stored as the remanent polarization in the ferroelectric capacitors. When the power supply voltage of the flipflop 3 starts to rise up, the potential of the storage nodes correspondingly rises up by action of the coupling of MOS transistors forming the inverters 1 and 2. Thus, the potential applied across each ferroelectric capacitor increases from 0 V towards a positive large voltage.

The ferroelectric capacitor holding the positive remanent polarization as the point B in FIG. 3 behaves as a small capacitance in comparison with that of the ferroelectric capacitor holding the negative remanent polarization as the point D. This would be apparent from the fact that the locus from the point B to the point A (the arrow Y1) depicted on the Q-V plane has an inclination gentler than that of the locus from the point D to the point A (the arrow Y2). Namely, the storage node connected to the former capacitance (smaller capacitance) rises up quicker than the other node.

If the power supply voltage continues to rise up so that one of the storage nodes exceeds a threshold voltage of the transistors constituting the inverters 1 and 2, a positive feedback is applied to the flipflop 3 so that a voltage difference between the storage nodes is amplified. Ultimately, the storage node held at the point B is brought into Vcc, and the storage node held at the point D is brought into the ground voltage. Finally, the plate line is set to Vcc/2, so that the ferroelectric capacitors are put in an idle condition. As a result, the ferroelectric capacitor which held Vcc before the shutoff of the electric power, holds the data at the point B, and then holds Vcc again after the electric power is turned on again. Similarly, the ferroelectric capacitor which held 0 V before the shutoff of the electric power, holds the data at the point D, and then, holds 0 V again after the electric power is turned on again.

As mentioned above, in the conventional shadow RAM using the ferroelectric capacitor, the data stored in the flipflop 3 is preserved after the electric power is shut off and then turned on. Therefore, it operates as a non-volatile memory. In addition, the data reading and the data writing can be performed similar to the conventional SRAM, since the flipflop 3 and the MOS transistors M0 and M1 function similar to the conventional SRAM.

It is known to constitute a memory cell disclosed in JP-A-63-201998, as a non-volatile memory device using a ferroelectric capacitor, by using one transistor and one ferroelectric capacitor, or alternatively two transistors and two ferroelectric capacitors. This stores information by the polarization direction of the ferroelectric capacitor, regardless of whether or not the electric power is supplied. In addition, since the reading becomes a destructive reading, the writing is carried out following the reading. Therefore, the number of accesses to the ferroelectric capacitor becomes very large, and under the present fabricating technology, reliability after use over a long time is not necessarily satisfactorily ensured. In the shadow RAM using the ferroelectric capacitor, on the other hand, the access to the ferroelectric capacitor is carried out only in the storing operation and in the recall operation, and therefore, a satisfactory reliability of the product can be ensured even in a ferroelectric capacitor having a relative poor performance.

In the prior art shadow RAM using the ferroelectric capacitor, the memory cell is constituted of one SRAM memory cell composed of the flipflop and the access transistors, and the two ferroelectric capacitors. Therefore, in the case that the flipflop is formed of a CMOS circuit, the number of elements in the SRAM memory cell part becomes six (six transistors). As mentioned above, in the prior art shadow RAM, the memory cell for storing one bit of information is constituted of the six transistors and the two ferroelectric capacitors, the increase in the sell size is unavoidable in comparison with the non-volatile memory device as disclosed in JP-A-63-201998, and therefore, it has a problem which is not suitable to increase the storage capacity.

BRIEF SUMMARY OF THE INVENTION

Accordingly, it is an object of the present invention to provide a shadow RAM cell using a ferroelectric capacitor, in which the number of transistors constituting a memory cell is reduced so that the storage capacity can be increased, a non-volatile memory device and a control method therefor.

According to the present invention, there is provided a memory cell characterized by comprising a pair of drive transistors cross-connected each other by connecting a gate of each drive transistor to a drain of the other drive transistor at a pair of storage nodes, a pair of access transistors on-off controlled by a common word line for selectively connecting the pair of storage nodes to a pair of bit lines, respectively, and a pair of ferroelectric capacitors having one end thereof directly connected to the pair of storage nodes, respectively, and the other end thereof connected to a plate line.

Furthermore, it is characterized in that an off-leak current of the access transistors is not less than ten times an off-leak current of the drive transistors. It is also characterized in that a precharge potential of the bit lines is a power supply voltage, so that at the storage node of a high potential side, both the drive transistor and the access transistor are off, and the storage node of the high potential side is held at a high potential near to the power supply voltage by action of the off-leak current of the access transistor, and on the other hand, at the storage potential of a low potential side, the drive transistor is in an on condition and the storage potential of the low potential side holds the ground potential.

Furthermore, it is characterized in that, in a store operation, the plate line is swung between the ground potential and the power supply potential while maintaining the pair of access transistors in an off condition, and in a recall operation, the potential of the bit line is pulled up from the ground potential to a predetermined power supply potential while maintaining the pair of access transistors in the off condition and while maintaining the plate line at the ground potential.

In addition, it is characterized in that, in the recall operation, the word line is brought to a second predetermined potential which is between the ground potential and the power supply potential, so that the pair of access transistors are put in an on condition of some degree, with the result that the storage node of the high potential side is more quickly pulled up to the power supply potential.

Moreover, it is characterized in that, in a power supplying condition excluding the store operation and the recall operation, the potential of the plate line is set to a first predetermined potential which is between the ground potential and the power supply potential, and this first predetermined potential is about a half of the power supply potential. It is also characterized in that, in the store operation, the potential of the plate line is changed from the first predetermined potential to the power supply potential and then to the ground potential in the order, or alternatively to the ground potential and then to the power supply potential in the order.

It is characterized in that, when the plate line is pulled down from the power supply potential or the first predetermined potential to the ground potential, this voltage pulling-down is carried slowly or in a step-by-step manner to spend a time of not less than 0.1 millisecond, for the purpose of ensuring that the potential of the storage node of the high potential side does not lower and the drive transistor of the low potential side is never turned off.

Alternatively, it is characterized in that, when the plate line is pulled down from the power supply potential or the first predetermined potential to the ground potential, the potential of the word line is brought to the second predetermined potential which is between the ground potential and the power supply potential, and the pair of access transistors are turned on to some degree, for the purpose of ensuring that the potential of the storage node of the high potential side does not lower and the drive transistor of the low potential side is never turned off.

Furthermore, it is characterized in that, in a power supplying condition excluding the store operation and the recall operation, a potential difference between opposite ends of each of the pair of ferroelectric capacitors (first predetermined potential—ground potential) and (power supply potential—first predetermined potential) is smaller than a coercive voltage of the ferroelectric capacitor.

According to the present invention, there is also provided a nonvolatile semiconductor memory device characterized by locating the memory cell mentioned above at each intersection of the pair of bit lines and the word line to form a matrix. It is also characterized in that the plate line of all the memory cells is connected in common. It is characterized by further including a plate line drive circuit for driving the common-connected plate line.

Furthermore, it is characterized in that, in the store operation, the plate line drive circuit drives the common-connected plate line from the first predetermined potential which is between the ground potential and the power supply potential, to the power supply potential and then to the ground potential in the order, or alternatively to the ground potential and then to the power supply potential in the order, and in that the plate line drive circuit carries out the store operation for all the memory cells connected to the plate line, in one lump. It is also characterized in that when the common-connected plate line is pulled down from the power supply potential or the first predetermined potential to the ground potential, the plate line drive circuit pulls down the voltage slowly or in a step-by-step manner to spend a time of not less than 0.1 millisecond.

In addition, it is characterized in that, in a power supplying condition excluding the store operation and the recall operation, the plate line drive circuit sets the potential of the common-connected plate line to a first predetermined potential which is between the ground potential and the power supply potential. It is also characterized in that, in the power supplying condition excluding the store operation and the recall operation, a potential difference between opposite ends of each of the pair of ferroelectric capacitors (first predetermined potential—ground potential) and (power supply potential—first predetermined potential) is set to be smaller than a coercive voltage of the ferroelectric capacitor.

According to the present invention, there is further provided a method for controlling a memory cell which comprises a pair of drive transistors cross-connected each other by connecting a gate of each drive transistor to a drain of the other drive transistor at a pair of storage nodes, a pair of access transistors on-off controlled by a common word line for selectively connecting the pair of storage nodes to a pair of bit lines, respectively, and a pair of ferroelectric capacitors having one end thereof directly connected to the pair of storage nodes, respectively, and the other end thereof connected to a plate line, characterized in that in a store operation, the plate line is swung between the ground potential and the power supply potential while maintaining the pair of access transistors in an off condition.

In addition, it is characterized in that, in a recall operation, the potential of the bit line is pulled up from the ground potential to a predetermined power supply potential while maintaining the pair of switching elements in the off condition and while maintaining the plate line at the ground potential, and in a power supplying condition excluding the store operation and the recall operation, the potential of the plate line is set to a first predetermined potential which is between the ground potential and the power supply potential.

Furthermore, it is characterized in that, in the store operation, the potential of the plate line is changed from the first predetermined potential to the power supply potential and then to the ground potential in the order, or alternatively to the ground potential and then to the power supply potential in the order, and in that when the plate line is pulled down from the power supply potential or the first predetermined potential to the ground potential, the voltage is pulled down slowly or in a step-by-step manner to spend a time of not less than 0.1 millisecond.

It is also characterized in that, in a power supplying operation excluding the store operation and the recall operation, a potential difference between opposite ends of each of the pair of ferroelectric capacitors (first predetermined potential—ground potential) and (power supply potential—first predetermined potential) is smaller than a coercive voltage of the ferroelectric capacitor.

Now, an operation of the present invention will be described. In the shadow RAM of the present invention, the memory cell is constructed by directly connecting the ferroelectric capacitors to the storage nodes of an unloaded 4-transistor SRAM cell. Therefore, the shadow RAM of the present invention can be constructed of four transistors which are less than those required in the prior art shadow RAM by two transistors, and can realize a storage capacity which is larger than that realized in the prior art shadow RAM. On the other hand, the store operation and the recall operation, which are carried out in the shadow RAM of the present invention, are different from those in the prior art.

In the shadow RAM of the present invention, in the power supplying condition excluding the store operation and the recall operation, the reading and the writing are carried out similarly to those in the prior art unloaded 4-transistor SRAM cell. In the store operation, the plate line is pulled up to the power supply voltage once and then pulled down to 0 V, so that a suitable writing pulse is applied to the ferroelectric capacitor. Incidentally, in order to prevent destruction of the data when the potential of the plate line is pulled down, the potential of the plate line is pulled down slowly or in a step-by-step manner to spend a time of not less than 0.1 millisecond. Alternatively, by turning on the access transistor to some degree, the potential of the storage node of the high potential side is prevented from lowering so that the stored data is protected.

Similarly to the prior art, in the recall operation, the potential of the bit line is simply elevated while maintaining the plate line at the ground potential, so that a voltage is applied across the ferroelectric capacitor, and the change of the capacitance characteristics attributable to the difference in the direction of polarization is amplified by the memory cell and the data is restored. Alternatively, even in the recall operation, the access transistor is put in an on condition of some degree, so that the amplification is performed quickly. Thus, a highly reliable non-volatile memory can be realized by expending a time for the store operation.

In addition, in the shadow RAM of the present invention, the recall operation can be carried out without using a sense amplifier and a write circuit. Therefore, the recall operation can be performed simultaneously in all the memory cells, so that the time required for the recall operation of all the memory cells can be shortened, and a control circuit can be simplified. Furthermore, since the ferroelectric capacitors are connected directly to the storage nodes which indicate either the ground potential or the power supply voltage, it is possible to apply a write pulse of the power supply voltage to the ferroelectric capacitor with no high voltage circuit.

Moreover, in the shadow RAM of the present invention, in the power supplying condition excluding the store operation and the recall operation, the plate line is set to an intermediate potential which is between the power supply potential and the ground potential, so that the voltage applied across the ferroelectric capacitor is relaxed to ½ of the power supply potential, with the result that deterioration of the capacitor can be prevented.

As mentioned above, the shadow RAM using the ferroelectric capacitor in accordance with the present invention uses the shadow RAM cell which comprises a pair of drive transistors cross-connected each other by connecting a gate of each drive transistor to a drain of the other drive transistor at a pair of storage nodes, a pair of access transistors on-off controlled by a common word line for selectively connecting the pair of storage nodes to a pair of bit lines, respectively, and a pair of ferroelectric capacitors having one end thereof directly connected to the pair of storage nodes, respectively, and the other end thereof connected to a plate line. Therefore, the shadow RAM using the ferroelectric capacitor in accordance with the present invention can reduce a chip area in comparison with the prior art shadow RAM. On the other hand, similarly to the prior art shadow RAM, since the recall operation and the store operation can be carried out without using a sense amplifier and a write circuit, all the memory cells can be recalled and stored simultaneously. Thus, a control circuit for controlling these operations can be realized with a small size similar to a control circuit of the prior art, since it is unnecessary to repeat these operations.

Furthermore, when data is written into the ferroelectric capacitor, it is possible to apply a write pulse of the power supply potential to the ferroelectric capacitor with using neither a voltage higher than the power supply potential nor a negative voltage. Therefore, in comparison with the prior art shadow RAM configured to apply the power supply voltage to the ferroelectric capacitor by using either a high voltage or a negative voltage, it is possible to expect reduction of the circuit scale, reduction of the chip area, and a process compatibility with a logic circuit which is provided mixedly in one chip and which does not use a high voltage.

DETAILED DESCRIPTION OF THE INVENTION

Now, embodiments of the present invention will be described with reference to the drawings.

Figure 1:
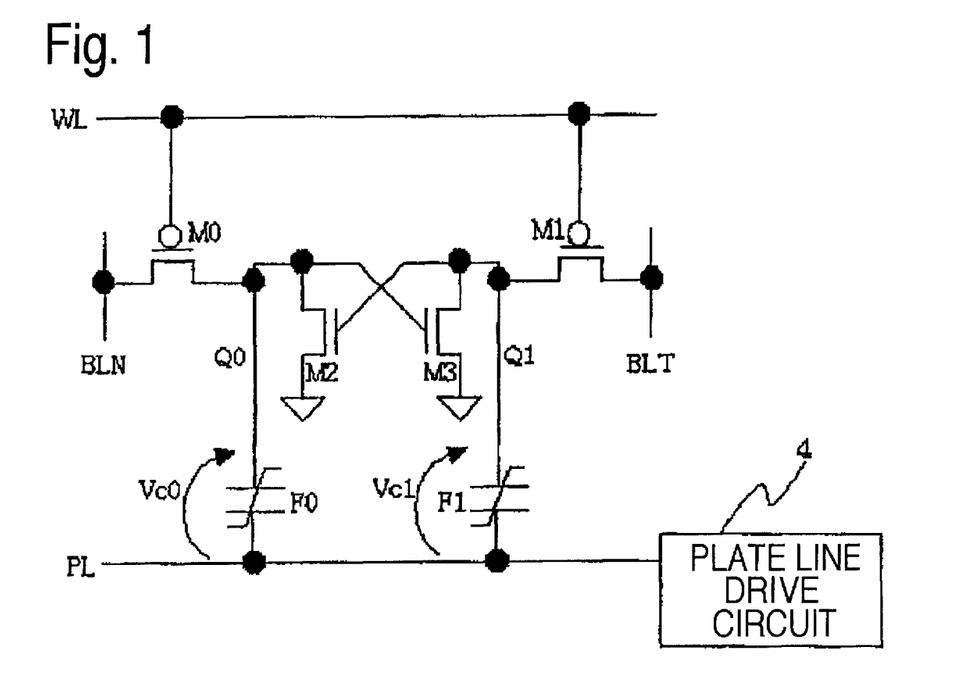
FIG. 1 is a circuit diagram of an embodiment of the present invention.

FIG. 1 is a circuit diagram of an embodiment of the shadow RAM using the ferroelectric capacitor, in accordance with the present invention. In the drawing, elements corresponding to those shown in FIG. 2 are given the same reference symbols. Two drive (NMOS) transistors M2 and M3 are cross-connected each other by connecting a gate of each transistor to a drain of the other transistor at a pair of storage nodes Q0 and Q1. The storage nodes Q0 and Q1 are connected to an inverted bit line BLN and a non-inverted bit line BLT through access (PMOS) transistors M0 and M1, respectively.

The inverted and non-inverted bit lines are paired, and one end of the inverted and non-inverted bit lines are connected to a sense amplifier (not shown) for comparing voltages on the inverted and non-inverted bit lines to each other. Furthermore, the bit lines are connected to a write circuit (not shown) for selectively connecting either of the bit lines to the ground potential in a writing operation, and a precharge circuit (not shown) for precharging the bit lines to the power supply potential. A gate of the access transistors M0 and M1 are connected to a common word line WL. The word line WL is connected to a decoder circuit (not shown) for selectively driving one word line to be accessed in accordance with an address signal.

An off-leak current of the access transistors M0 and M1 is not less than ten times an off-leak current of the drive transistors. Therefore, the potential of the storage node of a high potential side holds a potential near to the power supply potential which is the precharge potential of the bit line, because both the access transistor and the drive transistor connected to the storage node of the high potential side are in an off condition, and on the other hand, the storage node of a low potential side holds the ground potential since the drive transistor is turned on.

Ferroelectric capacitors F0 and F1 having one end connected to a common plate line PL, are directly connected to the storage nodes Q0 and Q1, respectively. The plate line PL is connected to a plate line drive circuit 4.

Now, an operation of this shadow RAM using the ferroelectric capacitor, which is the embodiment of the present invention, will be described. In a power supplying condition excluding a store operation and a recall operation, the plate line is set to about ½ of the power supply potential (Vcc). Therefore, the voltage applied across the ferroelectric capacitor becomes Vcc/2 or -Vcc/2. A data reading and writing operation carried out in the power supplying condition is similar to that in a prior art unloaded four-transistor SRAM disclosed in JP-A-56-51088, and therefore, explanation will be omitted.

Figure 6:
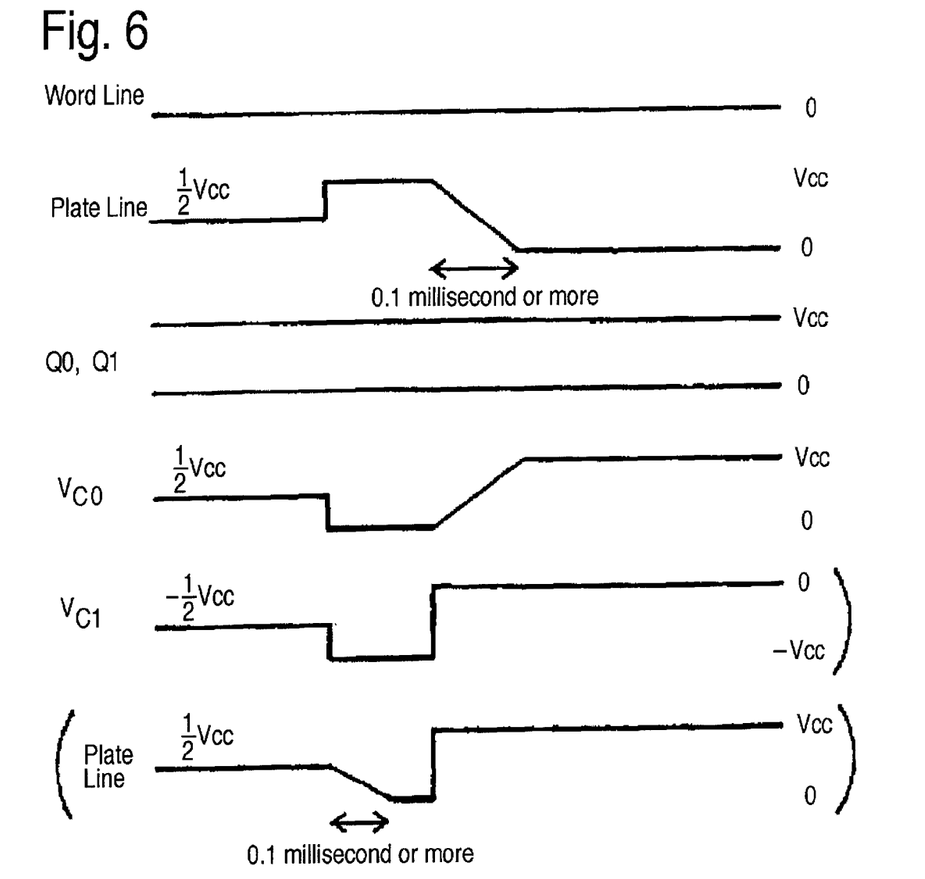
FIG. 6 is a timing chart of the store operation in the present invention.

Next, the store operation will be described with reference to FIG. 3 and FIG. 6. Here, FIG. 3 is a graph showing a hysteresis characteristics on the Q-V plane, of the ferroelectric capacitors F0 and F1 shown in FIG. 1. FIG. 6 is a timing chart of various parts in the store operation. In the shadow RAM of the present invention, the store operation of converting the data stored at the storage nodes Q0 and Q1 to the direction of the remanent polarization of the ferroelectric capacitors F0 and F1 when the electric power is shut off, is carried out, similarly to the prior art. This store operation is carried out by driving the plate line PL from Vcc/2 to Vcc and then to 0 V while maintaining the word line WL at a low level (Incidentally, as shown at the bottom column in FIG. 6, the plate line PL can be driven from Vcc/2 to 0 V and then to Vcc).

When the plate line PL is pulled up from Vcc/2 to Vcc, 0 V is applied across the ferroelectric capacitor connected to the storage node holding the power supply voltage, and on the other hand, -Vcc is applied across the ferroelectric capacitor connected to the storage node holding the ground potential. The ferroelectric capacitor applied with -Vcc moves to the point C in FIG. 3. Thereafter, when the plate line PL is pulled down to 0 V, Vcc is applied across the ferroelectric capacitor connected to the storage node holding the power supply voltage, and on the other hand, 0 V is applied across the ferroelectric capacitor connected to the storage node holding the ground potential. The ferroelectric capacitor applied with Vcc moves to the point A in FIG. 3.

Here, if the plate line PL is instantaneously pulled down to 0 V from the power supply potential, the storage node holding the power supply voltage is rapidly pulled down by a capacitive coupling through the ferroelectric capacitor. The dropped potential of the storage node needs a time of not less than 0.1 milliseconds until it returns to the power supply potential again by action of an off-leak current of the access transistor. Here, typical values of circuit parameters are that the capacitance of the ferroelectric capacitor is on the order of 100 fF, the off-leak current of the access transistor is on the order of 1 nA, and the power supply potential is a few volts. During a period until the storage node returns from the dropped potential, a potential difference between the storage node of the high potential side and the storage node of the low potential side is small, so that possibility of the stored data being destroyed by extrinsic noises becomes large. In addition, if the potential of the storage node of the high potential side becomes lower than a threshold voltage of the drive transistor, there occurs possibility that the potential of the storage node of the low potential side elevates to destroy the stored data.

Figure 7:
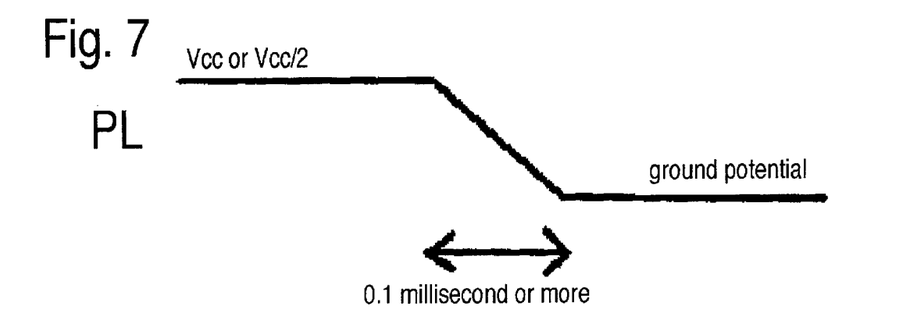
FIG. 7 illustrates one example of pulling down the potential of the plate line in the store operation of the present invention.
Figure 8:
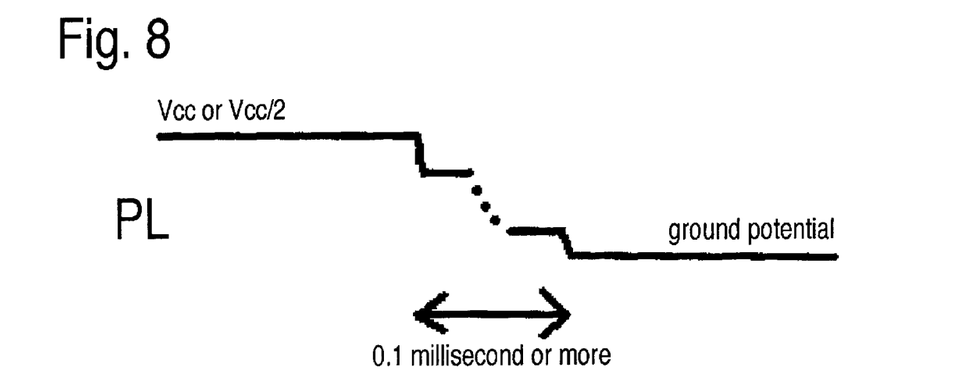
FIG. 8 illustrates another example of pulling down the potential of the plate line in the store operation of the present invention.

In the shadow RAM of the present invention, this problem is avoided by expending a time of not less than 0.1 millisecond for pulling down the plate line PL. A manner of pulling down the plate line PL is illustrated in FIGS. 7 and 8. If the potential of the plate line is pulled down slowly as shown in FIG. 7, it is possible to prevent the drop of the potential of the storage node of the high potential side. Alternatively, if the potential of the plate line is pulled down in a step-by-step manner to spend the time of not less than 0.1 millisecond in the whole pulling-down process, it is possible to control the drop of the potential of the storage node of the high potential side to a negligible degree.

Furthermore, in the shadow RAM of the present invention, when the potential of the plate line PL is pulled down, the potential of the word line is brought into a second predetermined potential which is between the ground potential and the power supply potential, so that the access transistors are turned on to some degree, and correspondingly, the drop of the potential of the storage node of the high potential side can be controlled to a negligible degree.

Finally, when the electric power is shut off so that all the nodes are discharged to the ground potential, the ferroelectric capacitor connected to the storage node which had held the power supply potential, holds a remanent polarization Pr at the point B in FIG. 3, and on the other hand, the ferroelectric capacitor connected to the storage node which had held the ground potential, holds a remanent polarization -Pr at the point D in FIG. 3. Namely, similarly to the prior art, the ferroelectric material holds the memory in the form of a remanent polarization in a condition that no electric power is supplied, with the result that the shadow RAM of the present invention operates as a non-volatile memory.

Figure 9:
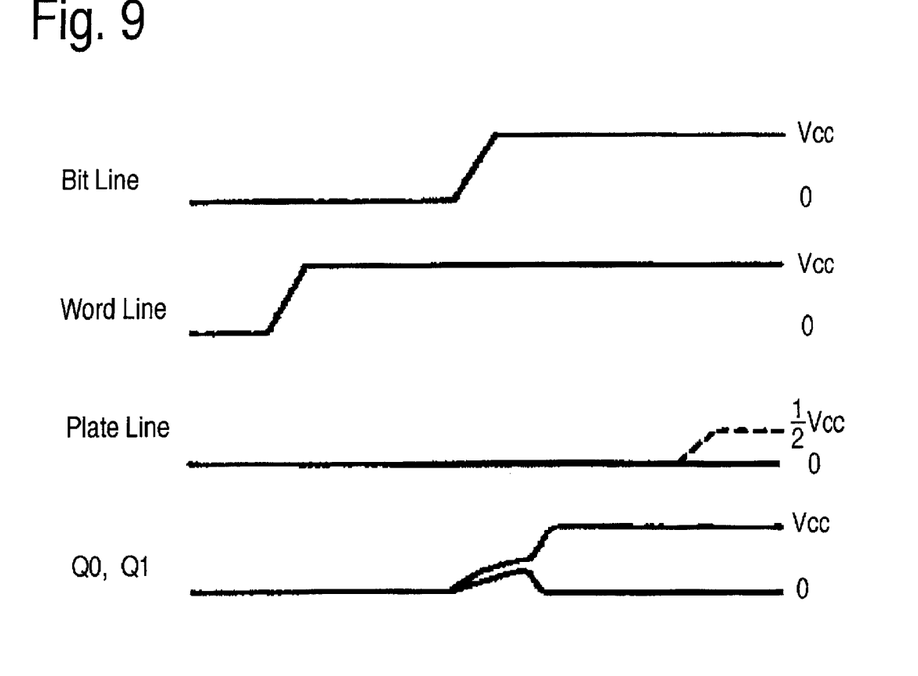
FIG. 9 is a timing chart of the recall operation in the present invention.

Next, the recall operation when the electric power is turned on, will be described with reference to the timing chart of FIG. 9. When the electric power is turned on, the word line WL is brought to the high level to maintain the access transistors in an off condition, the plate line PL is maintained at the low level, and the bit lines are precharged to the power supply potential, with the result that the data held by the ferroelectric capacitors in the form of the remanent polarization can be reproduced to potentials on the storage nodes Q0 and Q1. When the potential of the bit line starts to elevate, the potential of the storage node correspondingly elevates by the off-leak current of the access transistor. Thus, the voltage applied across the ferroelectric capacitor shifts greatly toward a positive voltage from 0 V.

The ferroelectric capacitor holding the positive remanent polarization at the point B in FIG. 3, behaves as a capacitance smaller than that of the ferroelectric capacitor holding the negative remanent polarization at the point D in FIG. 3. This would be apparent from the fact that the locus from the point B to the point A (the arrow Y1) depicted on the Q-V plane has an inclination gentler than that of the locus from the point D to the point A (the arrow Y2). Namely, the storage node connected to the former capacitance (smaller capacitance) rises up quicker than the other node.

Furthermore, if the potential of the bit line continues to rise up so that one of the storage nodes exceeds the threshold voltage of the drive transistor, a positive feedback is applied by the drive transistor so that a voltage difference between the storage nodes is amplified. Ultimately, the storage node held at the point B becomes Vcc, and on the other hand, the storage node held at the point D becomes the ground voltage. Finally, the plate line is set to Vcc/2 so that the ferroelectric capacitors are put in an idle condition.

As a result, the ferroelectric capacitor which had held Vcc before the electric power is shut off, held the data by the point B, and holds Vcc again after the electric power is turned on. Similarly, the ferroelectric capacitor which had held 0 V before the electric power is shut off, held the data by the point D, and holds 0 V again after the electric power is turned on.

Alternatively, in the recall operation, the shadow RAM of the present invention can fasten the elevation of the potential of the storage node and therefore can complete the recall operation for a short time, by setting the word line to a predetermined which is between the ground potential and the power supply potential so that the word line is brought into an on condition to some degree.

As mentioned above, the ferroelectric capacitor of the present invention operates as a non-volatile memory in which the data stored by the potentials of the storage nodes Q0 and Q1 are preserved after the electric power is shut off and turned on again. In addition, the reading and the writing of the data can be carried out similarly to the prior art unloaded four-transistor SRAM.

As described above, in the ferroelectric capacitor of the present invention, neither the sense amplifier nor the write circuit is used in the recall operation. Therefore, the recall operation can be realized for all the memory cells in one lump, so that the time of the recall operation can be shortened, and a necessary control circuit can be simplified. For a similar reason, the shadow RAM of the present invention can realize the plate line by a wiring conductor in common to all the memory cells. Thus, the number of necessary plate line drive circuits can be reduced, and the circuit area can be correspondingly reduced.

Figure 10:
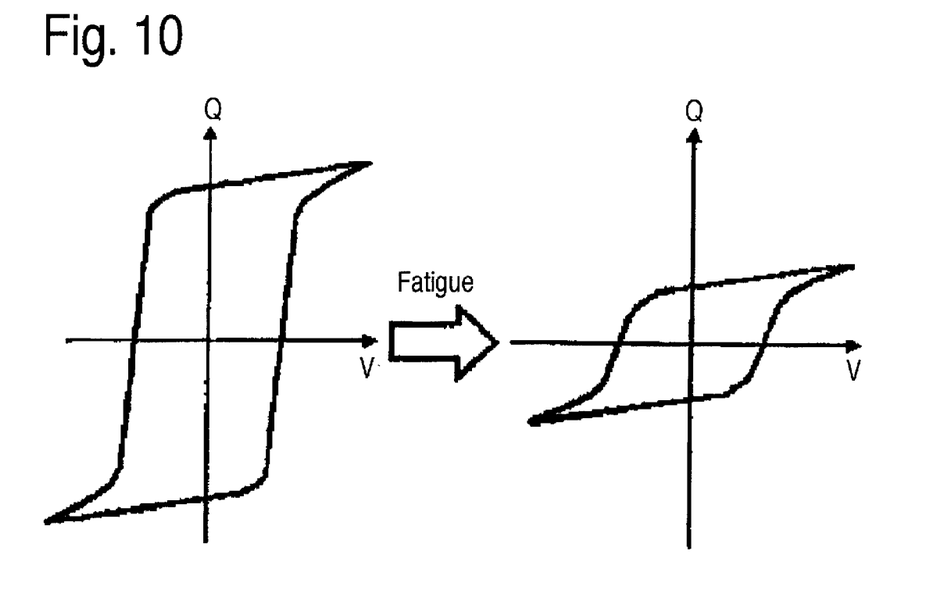
FIG. 10 illustrates a fatigue deterioration caused by the number of polarization inversions in the ferroelectric capacitor.

In the shadow RAM of the present invention, the plate line PL is brought into a first predetermined potential between Vcc and 0 V (preferably, about Vcc/2) in an ordinary operation, so that the potential applied across the ferroelectric capacitor can be relaxed to about Vcc/2. By optimizing the composition, the film thickness and the structure of the ferroelectric capacitor, Vcc/2, which is the voltage applied across the ferroelectric capacitor in the ordinary operation, can be made smaller than a coercive voltage Vc, so that in the ordinary operation excluding the store operation and the recall operation, the polarization of the ferroelectric capacitor does not change, and therefore, fatigue deterioration caused by the number of polarization inversions can be avoided, with the result that no problem occurs (FIG. 10 illustrates an example of the deterioration in the hysteresis characteristics caused by the fatigue deterioration).

Figure 11:
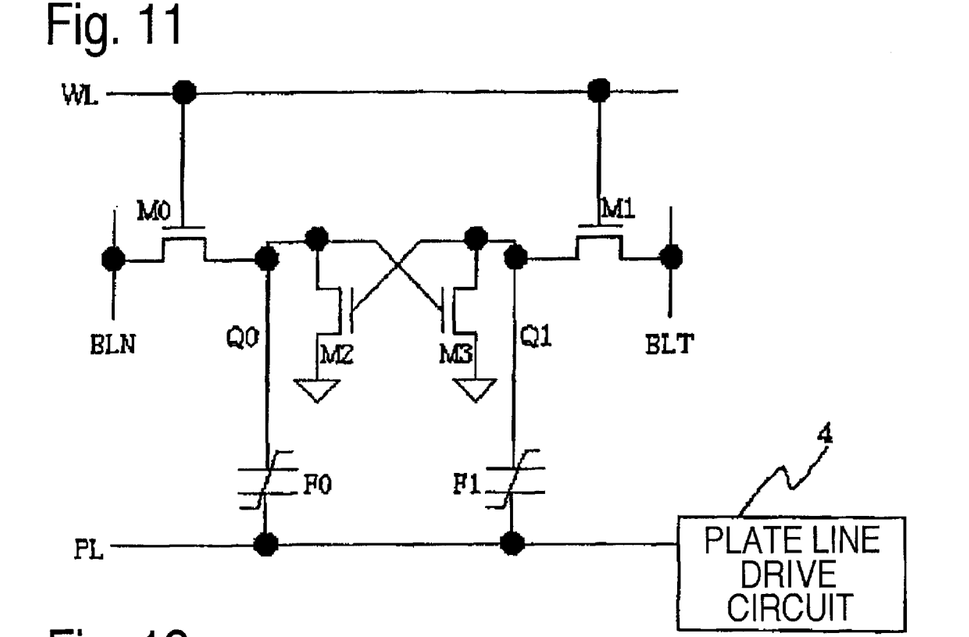
FIG. 11 is a circuit diagram of a modification of the embodiment of the present invention.

Incidentally, the shadow RAM cell shown in FIG. 1 comprises the four transistors in total (including the two access transistors of the PMOS transistor and the two drive transistors of the NMOS transistors) and the two ferroelectric capacitors. However, as shown in FIG. 11, the present invention can be applied to such a construction in which all the drive transistors and the access transistors are of MOS transistor. Furthermore, the present invention can be applied to a high resistance four-transistor memory cell so constructed that the potential of the storage node of the high potential side is maintained by a slight leak current through a high resistance load (four transistors per one memory cell). In addition, it is a matter of course that the memory cell of the present invention having the structure shown in FIG. 1 can be used as a so-called temporary memory.

Figure 12:
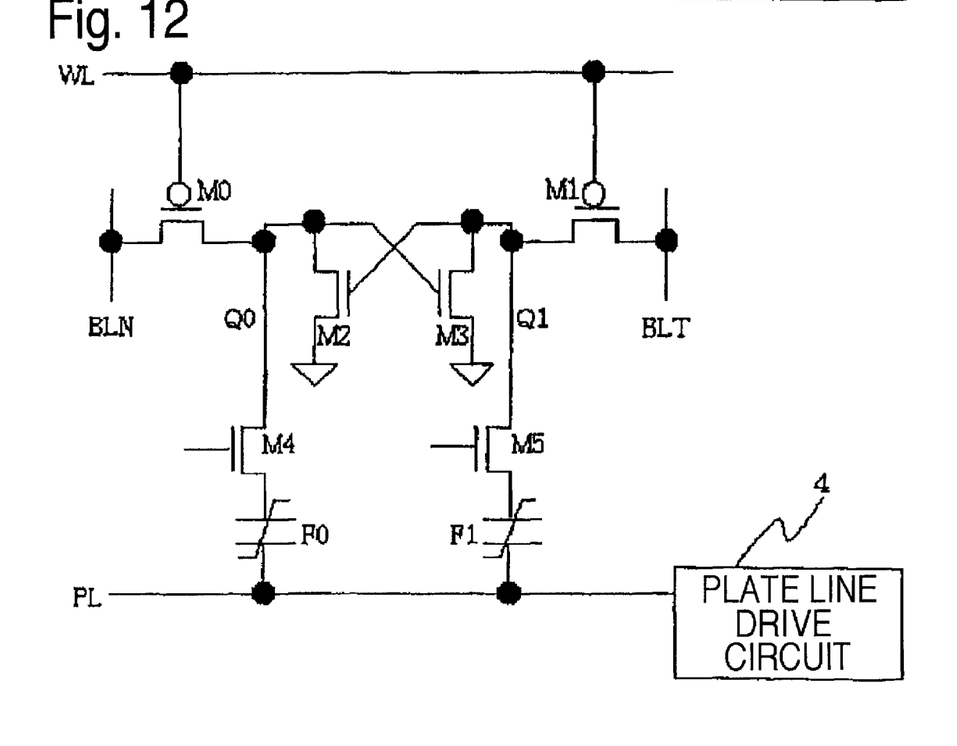
FIG. 12 is a circuit diagram of a second embodiment of the present invention.

FIG. 12 is a circuit diagram of a second embodiment of the present invention. In this second embodiment, each storage node is connected to the corresponding ferroelectric capacitor through a transfer gate. In a power supplying condition excluding the store and recall operations, the transfer gate transistors are maintained in an off condition, and the plate line is maintained at the ground potential, with the result that the voltage across the ferroelectric capacitor can be made to almost 0 (zero).

Therefore, the second embodiment of the present invention can be constituted of transistors of the same number as that of transistors used in the prior art shadow RAM memory cell. On the other hand, in the power supplying condition excluding the store and recall operations, the bias voltage across the ferroelectric capacitor can be completely brought to 0 (zero). Accordingly, a further reliable shadow RAM can be realized.

As mentioned above, according to the present invention, since the memory cell is constituted of the unloaded four-transistor SRAM cell and the two ferroelectric capacitors, an advantage can be obtained that the memory cell is formed of the four transistors which are smaller in number than those in the prior art shadow RAM, and that the stored data is prevented from being destroyed in the process of pulling down the potential of the plate line in the store operation, so that reliability of a memory holding can be elevated. Furthermore, according to the present invention, similarly to the prior art shadow RAM, since the store operation and the recall operation can be carried out in all the memory cell in one lump, the operation time can be shortened and the control circuit can be simplified.

In addition, in the ordinary power supplying condition, the plate line is maintained at about Vcc/2 so that the electric field applied to the ferroelectric capacitor is relaxed. Comparing with the prior art shadow RAM in which no voltage is applied across the ferroelectric capacitor, it may be apprehensive for deterioration of the capacitor but the deterioration of the capacitor can be minimized to an almost negligible level, if about Vcc/2 can be made smaller than a coercive voltage so that no influence is given to polarization.

What is claimed is:

1. A memory cell comprising:
   a pair of drive transistors cross-connected such that a gate of each drive transistor is connected to a drain of the other drive transistor at a pair of storage nodes;
   a pair of access transistors controlled by a common word line for selectively connecting said pair of storage nodes to a pair of bit lines, respectively; and
   a pair of ferroelectric capacitors having one end thereof directly connected to said pair of storage nodes, respectively, and the other end thereof connected to a plate line,
   wherein only said drive transistor gates and drains, said access transistors and said ferroelectric capacitors are connected to said storage nodes.

2. A memory cell claimed in claim 1 wherein the conductivity of said access transistors is different from the conductivity of said drive transistors.

3. A memory cell claimed in claim 1 wherein, in a store operation, said plate line is swung between a ground potential and a power supply potential while maintaining said pair of access transistors in an off condition.

4. A memory cell claimed in claim 1 wherein, in a recall operation, the bit line is pulled up from a ground potential to a predetermined power supply potential while maintaining said pair of access transistors in the off condition and while maintaining said plate line at the ground potential.

5. A memory cell claimed in claim 1 wherein, in a recall operation, said word line is brought to a predetermined potential which is between a ground potential and a power supply potential so that said pair of access transistors are put in an on condition of some degree, and the bit line is pulled up from a ground potential to a predetermined power supply potential while maintaining said plat line at the ground potential.

6. A memory cell claimed in claim 1 wherein, in a power supplying condition excluding a store operation and a recall operation, the potential of said plate line s set to a first predetermined potential which is between a ground potential and a power supply potential.

7. A memory cell claimed in claim 6 wherein, said first predetermined potential is bout a half of said power supply potential.

8. A memory cell claimed in claim 6 wherein, in said store operation, the potential of aid plate line is changed from said first predetermined potential to said power supply potential and then to the ground potential in the order, or alternatively to the ground potential and then to said power supply potential in the order.

9. A memory cell claimed in claim 8 wherein, in said store operation, when the potential of said plate line is pulled down from said power supply potential to the ground potential or alternatively from said first predetermined potential to the ground potential, the voltage changes slowly or in a step-by-step manner to spend a time of not less than 0.1 millisecond.

10. A memory cell claimed in claim 8 wherein, in said store operation, when the potential of said plate line is pulled down from said power supply potential to the ground potential or said first predetermined potential to the ground potential, the potential of said word line is brought to a second predetermined potential which is between the ground potential and said power supply potential, and said access transistors are turned on to some degree.

11. A memory cell claimed in claim 6 wherein, in the power supplying condition excluding said store operation and said recall operation, a potential difference between opposite ends of each of said pair of ferroelectric capacitors is smaller than a coercive voltage of the ferroelectric capacitor.

12. A non-volatile memory device constituted by locating the memory cell defined in claim 1 at each intersection between the pair of bit lines and the word line to form a matrix.

13. A non-volatile memory device claimed in claim 12 wherein said plate line of all said memory cells is connected in common.

14. A non-volatile memory device claimed in claim 13 further including a plate line drive circuit for driving the common-connected plate line.

15. A non-volatile memory device claimed in claim 14, wherein in a store operation, said late line drive circuit changes the potential of said common-connected plate me from a first predetermined potential which is between a ground potential and a power supply potential, to said power supply potential and then to the round potential in the order, or alternatively to the ground potential and then to said power supply potential in the order.

16. A non volatile memory device claimed in claim 15, wherein in a store operation, when said plate line drive circuit changes the potential of said common-connected plate line from said power supply potential to the ground potential or alternatively from said first predetermined potential to the ground potential, said plate line drive circuit changes the voltage slowly or in a step-by-step manner to spend a time of not less than 0.1 millisecond.

17. A non-volatile memory device claimed in claim 14, wherein said plate line drive circuit carries out said store operation for all the memory cells connected to said plate line in one lump.

18. A non-volatile memory device claimed in claim 14, wherein in a power supplying condition excluding a store operation and a recall operation, said plate line drive circuit sets the potential of said common-connected plate line to a first predetermined potential which is between the ground potential and said power supply potential.

19. A non-volatile memory device claimed in claim 14, wherein in a power supplying condition excluding a store operation and a recall operation, said plate line drive circuit sets a potential difference between opposite ends of each of laid pair of ferroelectric capacitors to a value which is smaller than a coercive voltage of the ferroelectric capacitor.

20. A control method for the memory cell defined in claim 1, wherein in a store operation, said plate line is swung between a ground potential and a power supply potential while maintaining said pair of access transistors in an off condition.

21. A control method claimed in claim 20 wherein, in a recall operation, the bit line is pulled up from a ground potential to a predetermined power supply potential while maintaining said pair of access transistors in an off condition and while maintaining said plate line at the ground potential.

22. A control method claimed in claim 20 wherein, in a power supplying condition excluding a store operation and a recall operation, the potential of said plate line is set to a first predetermined potential which is between a ground potential and a power supply potential.

23. A control method claimed in claim 22 wherein, said first predetermined potential is about a half of said power supply potential.

24. A control method claimed in claim 22 wherein, in said store operation, the potential of said plate line is changed from said first predetermined potential to said power supply potential and then to the ground potential in the order, or alternatively to the ground potential and then to said power supply potential in the order.

25. A control method claimed in claim 24 wherein, in said store operation, when the potential of said plate line is pulled down from said power supply potential to the ground potential or alternatively from said first predetermined potential to the ground potential, the voltage is caused to change slowly or in a step-by-step manner to spend a time of not less than 0.1 millisecond.

26. A control method claimed in claim 22 wherein, in the power supplying condition excluding said store operation and said recall operation, a potential difference between opposite ends of each of said pair of ferroelectric capacitors is made smaller than a coercive voltage of the ferroelectric capacitor.

27. A memory device comprising:
a memory cell including
a pair of drive transistors cross-connected such that a gate of each drive transistor is connected to a drain of the other drive transistor at a pair of storage nodes;
a pair of access transistors controlled by a common word line for selectively connecting aid pair of storage nodes to a pair of bit lines, respectively; and a pair of ferroelectric capacitors having one end thereof directly connected to said pair f storage nodes, respectively, and the other end thereof connected to a plate line, wherein only said drive transistor gates and drains, said access transistors and said ferroelectric capacitors are connected to said storage nodes; and a plate line driving circuit for driving said plate line during a store operation in accordance with a pattern that comprises one of changing the potential of the plate line from a first predetermined potential that is between a ground potential and a power supply potential to said power supply potential and then to said ground potential, and changing the potential of the plate line from said first predetermined potential to said ground potential and then to said power supply potential, wherein a duration of a transition between said first predetermined potential and aid power supply potential or said ground potential is not less than 0.1 millisecond.

* * * * *